United States Patent [19]

Tseng

[11] Patent Number: 5,854,105
[45] Date of Patent: Dec. 29, 1998

[54] METHOD FOR MAKING DYNAMIC RANDOM ACCESS MEMORY CELLS HAVING DOUBLE-CROWN STACKED CAPACITORS WITH CENTER POSTS

[75] Inventor: Horng-Huei Tseng, Hsinchu, Taiwan

[73] Assignee: Vanguard International Semiconductor Corporation, Hsin-Chu, Taiwan

[21] Appl. No.: 964,809

[22] Filed: Nov. 5, 1997

[51] Int. Cl.$^6$ ................................................ H01L 21/8242
[52] U.S. Cl. ............................................ 438/253; 438/254
[58] Field of Search .................................. 438/238, 239, 438/253–256, 381, 396–399

[56] References Cited

U.S. PATENT DOCUMENTS

| | | | |
|---|---|---|---|
| 5,399,518 | 3/1995 | Sim et al. | 437/52 |
| 5,443,993 | 8/1995 | Park et al. | 437/60 |
| 5,491,103 | 2/1996 | Ahn et al. | 438/253 |
| 5,508,222 | 4/1996 | Sakao | 438/253 |
| 5,545,582 | 8/1996 | Roh | 437/52 |
| 5,700,709 | 12/1997 | Park et al. | 438/254 |

Primary Examiner—Joni Chang
Attorney, Agent, or Firm—George O. Saile; Stephen B. Ackerman

[57] ABSTRACT

An array of DRAM cells having double-crown capacitors with a center post to increase capacitance is achieved. A planar insulating layer is formed over FETs in an array of cells. Node contact openings are etched to each FET. A first polysilicon layer is deposited to fill the node contact openings and provide a polysilicon planar surface. A thick insulating layer is deposited on the first polysilicon layer, and patterned leaving portions having essentially vertical sidewalls over the contact openings. A conformal second polysilicon layer is deposited and etched back to form first polysilicon spacers and the thick insulating layer is removed. A conformal doped silicon oxide layer is deposited over the first polysilicon spacers and etched back to form inner and outer insulating sidewall spacers. A third polysilicon layer is deposited sufficiently thick to fill the opening between the inner insulating sidewall spacers, and the third and first polysilicon layers are etched back to form second polysilicon spacers on the outer insulating sidewall spacers, and a center post between the inner insulating spacers to form the capacitor bottom electrodes. The insulating spacers are removed and a capacitor dielectric layer and a fourth polysilicon layer are deposited to form the top electrodes to complete the double-crown capacitor having a center post.

28 Claims, 6 Drawing Sheets

METHOD FOR MAKING DYNAMIC RANDOM ACCESS MEMORY CELLS HAVING DOUBLE-CROWN STACKED CAPACITORS WITH CENTER POSTS

BACKGROUND OF THE INVENTION (1) Field of the Invention

The present invention relates to semiconductor integrated circuits, and more particularly to a method for fabricating an array of dynamic random access memory (DRAM) cells with double-crown capacitors having center posts to increase capacitance while maintaining high density memory cells.

(2) Description of the Prior Art

Dynamic random access memory (DRAM) circuits (devices) are extensively used in the electronics industry, and more particularly in the computer industry for storing data in binary form (1 and 0) as charge on a storage capacitor. These DRAM devices are made on semiconductor substrates (or wafers) and then the substrates are diced to form the individual DRAM circuits (or DRAM chips). Each DRAM circuit (chip) consists in part of an array of individual DRAM storage cells that store binary data (bits) as electrical charge on a storage capacitor. Further, the information is stored and retrieved from the storage capacitor by means of switching on or off a single access transistor (via word lines) in each memory cell using peripheral address circuits, while the charge is stored on the capacitor or sensed via bit lines and by read/write circuits on the periphery of the DRAM chip.

The access transistor is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires increased refresh cycles that periodically restore the charge on these volatile storage cells. This further reduces the performance (speed) of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the access transistors within each cell area, rather than forming trench capacitors which need to be etched to increasing depths in the substrate to maintain the necessary capacitance. The stacked capacitors also provide increased latitude in capacitor design and processing while reducing cell area. More specifically, the stacked capacitors can be built in the vertical extensions (third dimension) to increase the stacked capacitor area, and therefore to increase the capacitance.

Numerous methods of making DRAM circuits using stacked capacitors have been reported in the literature. One method of making double-cylindrical (or double-crown capacitors) stacked capacitors using sidewall spacers is described by Park et al. in U.S. Pat. No. 5,443,993. Another approach for making a double-cylindrical capacitor using sidewall spacers is taught by Roh in U.S. Pat. No. 5,545,582.

Still another approach is taught by Sim, et al. in U.S. Pat. No. 5,399,518, in which an a sidewall spacer mask is used to etch a double-cylindrical electrode in a single conductive layer.

However, to be cost competitive in making DRAMs, it is very desirable to further increase the capacitance while simplifying the manufacturing process.

SUMMARY OF THE INVENTION

Accordingly, it is a principal object of the present invention to provide DRAMs with double-crown capacitors having a center post for increased capacitance.

Another object of this invention is to form these double-crown capacitors with a center post using a single photoresist mask to form the bottom electrodes and a series of self-aligning process steps that is manufacturing cost-effective.

The method for making this DRAM device with double-crown capacitors having center posts begins by providing a semiconductor substrate. Typically the substrate is a single-crystal silicon substrate doped with a P type conductive dopant, such as boron (B). A relatively thick Field OXide (FOX) is formed surrounding and electrically isolating each device area. The field oxide is typically formed using the LOCal Oxidation of Silicon (LOCOS) method, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for the FETs. Then a polysilicon layer or a polycide (polysilicon/silicide) layer, having a cap oxide ($SiO_2$) thereon, is patterned to form the FET gate electrodes and the interconnecting word lines for the array of memory cells on the DRAM device. Typically for DRAM memory cells the access transistor is an N-channel FET. Next, lightly doped source/drain regions, self-aligned to the FET gate electrodes, are formed by ion implantation. A spacer silicon oxide ($SiO_2$) layer is deposited and anisotropically etched back to form spacers on the sidewalls of the gate electrodes. Source/drain contact regions are formed next in the device areas adjacent to the insulating sidewall spacers by a second ion implantation. A first insulating layer, composed of a $SiO_2$ layer and a $Si_3N_4$ layer, is deposited over the device areas and on the field oxide areas. A thicker second insulating layer, such as $SiO_2$, is deposited on the first insulating layer and is then planarized. Contact openings are etched in the second and first insulating layers to the device areas where electrical contacts are required for the stacked capacitors (to one of the two source/drain areas of the FET in each of the DRAM cells).

The double-crown capacitors with the center post are now formed by depositing an in-situ doped first polysilicon layer that is sufficiently thick to fill the contact openings in which electrical contact to the device areas on the substrate are made. A relatively thick third insulating layer, composed of a disposable doped $SiO_2$, is deposited on the first polysilicon layer. The third insulating layer is patterned by conventional photolithographic techniques and anisotropic etching, leaving portions of the third insulating layer having essentially vertical sidewalls over the contact openings. A second polysilicon layer is then conformally deposited on the patterned third insulating layer, and is anisotropically plasma etched back to form first polysilicon spacers on the sidewalls of the patterned third insulating layer. The disposable patterned third insulating layer is then selectively removed, such as in hydrofluoric (HF) acid, leaving the first polysilicon spacers extending upward on the first polysilicon layer. A doped conformal fourth insulating layer (also disposable) is deposited over the first polysilicon spacers and is anisotropically etched back to form disposable inner and outer insulating sidewall spacers on the first polysilicon spacers. A conformal doped third polysilicon layer is deposited over the inner and outer insulating sidewall spacers. The thickness of the third polysilicon layer is sufficient to fill the space (opening) within the inner insulating sidewall spacers to form a center post for the capacitor, which also protects the first polysilicon layer from being etched in the capacitor area during the next etching step. The third polysilicon layer is then anisotropically etched back to form second polysilicon spacers on the outer insulating sidewalls spacers, and the etching is continued to remove the first polysilicon layer over the undoped second insulating layer outside the capacitor area. This overetching to remove the first polysilicon layer results in bottom electrodes for the capacitors that are electrically isolated from each other, and exposes the top surface of the disposable insulating sidewall spacers. The insulating sidewall spacers are then selectively removed by etching, such as in HF acid, while leaving the undoped second insulating layer essentially unetched. Alternatively, the fourth insulating layer can be a $Si_3N_4$ which can also be selectively removed in phosphoric acid without etching the second insulating layer ($SiO_2$). This etching step completes the capacitor bottom electrodes having a double-crown shape with a center post. The capacitors are now completed by depositing a thin capacitor dielectric layer having a high dielectric (high k) constant, and depositing a fourth polysilicon layer which is patterned to form the capacitor top electrodes.

BRIEF DESCRIPTION OF THE DRAWINGS

The objects and advantages of this invention are best understood with reference to the attached drawings in FIGS. 1 through 11, and the embodiment that follows.

DESCRIPTION OF THE PREFERRED EMBODIMENT

The method for making the DRAM cells having these improved capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Figure 1:
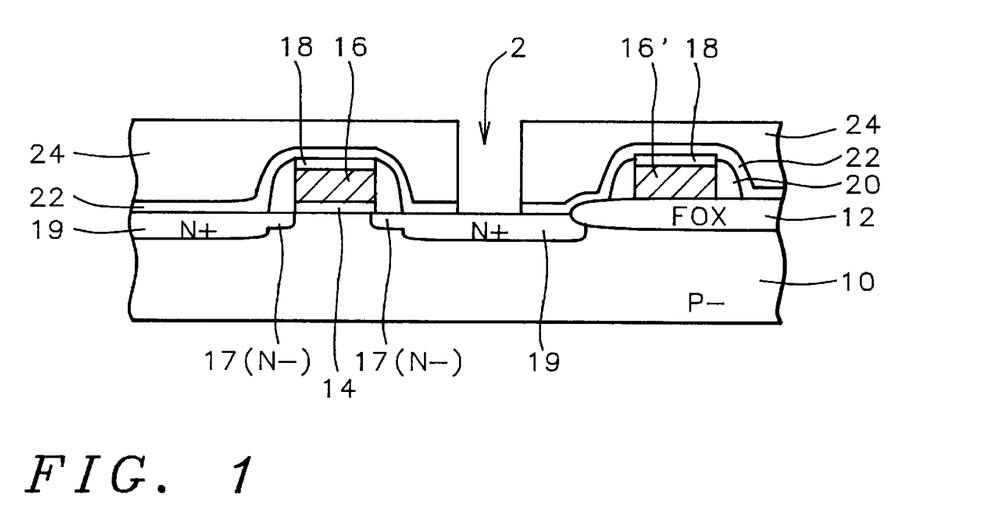
FIGS. 1 through 11 show schematic cross-sectional views for one of the cell regions of an array of DRAM cells illustrating in detail the fabrication steps for making the double-crown stacked storage capacitor with a center post by the method of this invention.

Referring now to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P type single-crystal silicon having a <100>crystallographic orientation. A relatively thick Field OXide (FOX) 12 is formed to surround and electrically isolate the individual device regions in which the memory cells are built. The field oxide 12, which is only partially shown in FIG. 1, is most commonly formed by the LOCal Oxidation of Silicon (LOCOS) method. Briefly the LOCOS method uses a thin $SiO_2$ (pad oxide) as a stress release layer and a thicker silicon $Si_3N_4$ layer that serves as an oxidation barrier layer on the pad oxide on the substrate surface (not shown in FIG. 1). Also not depicted in the drawings, conventional photolithographic techniques and etching are used to remove the $Si_3N_4$ barrier layer in areas where a field oxide is required, while retaining the $Si_3N_4$ over the active device areas to prevent oxidation. The silicon substrate is then thermally oxidized to form the field oxide areas 12. The field oxide is usually grown to a thickness of between about 3000 and 6000 Angstroms, and the silicon nitride barrier layer and pad oxide are removed in a wet etch. For example, the nitride can be removed in a hot phosphoric acid ($H_3PO_4$) etch, and the pad oxide can be removed in a dilute solution of hydrofluoric acid and water ($HF/H_2O$). Other field oxide isolation methods can be used which allow even more closely spaced device areas and higher cell density. For example shallow trench isolation (STI) and the like can be used with this invention.

An array of access transistors (N-channel FETs) is now formed in the active device regions, one of which is shown in FIG. 1. The surface of the silicon substrate 10 in the device area is thermally oxidized to form a thin gate oxide 14 for the N-channel FET. The gate oxide 14 is grown to a thickness of between about 50 and 150 Angstroms. An electrically conducting layer 16 having a cap oxide 18 is deposited and patterned to form the FET gate electrodes 16 over the device areas, and to form the interconnecting word lines 16' over the field oxide for the DRAM cells. Layer 16 is composed of an heavily doped polysilicon layer deposited by low-pressure chemical vapor deposited (LPCVD) and deposited to a preferred thickness of between about 1500 and 3500 Angstroms. For example, the polysilicon layer can be conductively doped with arsenic (As) or phosphorus (P) to a concentration of between about 1.0 E 19 and 1.0 E 21 atoms/cm$^3$. Alternatively, layer 16 can be a polycide (polysilicon/refractory metal silicide) layer to improve the electrical conductivity. For example, a tungsten silicide ($WSi_2$) layer can be deposited by CVD using a reactant gas such as tungsten hexafluoride ($WF_6$) and silane ($SiH_4$). Typically, the $WSi_2$ is deposited to a thickness of between about 500 and 1500 Angstroms, providing a polycide layer having a total thickness of between about 1500 and 3500 Angstroms. A cap oxide layer 18, composed of $SiO_2$, is deposited next on layer 16. The cap oxide 18 is also deposited using LPCVD by decomposing a reactant gas, such as tetraethosiloxane (TEOS). Typically, the thickness of the cap oxide layer 18 is between about 600 and 2000 Angstroms. Conventional photolithographic techniques and anisotropic plasma etching are then used to pattern the conducting layer 16 to form the gate electrodes 16 having a cap oxide 18, as shown in FIG. 1. Concurrently word lines 16' are formed over the FOX regions 12.

Still referring to FIG. 1, source/drain regions are formed adjacent to the gate electrodes and typically include lightly doped source/drain regions to minimize short-channel effects for sub-half-micron channel FETs. The lightly doped source/drain regions 17(N$^-$) are formed first by ion implantation and are self-aligned to the FET gate electrodes 16. The lightly doped source/drain regions 17(N$^-$) for N-channel FETs, typically used as the access transistor in DRAM cells, are formed by ion implantation of an N type dopant, such as arsenic (As) or phosphorus (P). For example, a typical implant might consist of phosphorus $P^{31}$ at a dose of between about 1 E 13 and 1 E 14 atoms/cm$^2$ and at an energy of between about 20 and 40 KeV. The gate electrodes serve as an implant mask to self-align the lightly doped source/drain regions 17(N$^-$) to the gate electrodes, while an additional patterned photoresist can be used to prevent implantation elsewhere on the substrate where it is not needed.

Sidewall spacers 20 are formed on the sidewalls of the gate electrode 16, as shown in FIG. 1. Typically the sidewall spacers 20 are formed by depositing a conformal low-temperature spacer silicon oxide, such as TEOS oxide, and anisotropically blanket etching back the oxide to the surface of the substrate 10. For example, the spacer oxide can be deposited using LPCVD and TEOS at a temperature in the range of about 650 to 900° C. The etchback is carried out in a reactive ion etcher (RIE) or high-density plasma (HDP) etcher using an etching gas such as trifluoromethane (CHF$_3$). An N$^+$ source/drain ion implantation is then used to complete the source/drain regions forming the N+doped source/drain contact regions 19(N+) aligned to the sidewall spacers 20, and therefore also aligned to the lightly doped source/drain regions 17, as shown in FIG. 1. This completes the FET, which serves as the access transistor in each of the memory cell areas.

Continuing with FIG. 1, a first insulating layer 22, composed of a SiO$_2$ layer and an upper Si$_3$N$_4$ layer, is deposited conformally over the device areas and the FOX areas to a thickness of between about 1000 and 2500 Angstroms. Preferably layer 22 is deposited by LPCVD using, for example, TEOS for depositing the SiO$_2$, and dichlorosilane (SiCl$_2$H$_2$) and ammonia (NH$_3$) for depositing the Si$_3$N$_4$. Preferably the Si$_3$N$_4$ layer is between about 500 and 2000 Angstroms thick. A thicker second insulating layer 24, preferably composed of an undoped SiO$_2$, is deposited, for example by chemical vapor deposition, and is deposited to a thickness of between about 3000 and 10000 Angstroms. Layer 24 is then planarized by chemical/mechanical polishing (CMP). Conventional photolithographic techniques and anisotropic plasma etching are used to form node contact openings 2 in the second and first insulating layers (24 and 22) to one of the two source/drain contact regions 19(N$^+$) to provide node contacts for the stacked storage capacitors, one of which is depicted in FIG. 1.

Figure 2:
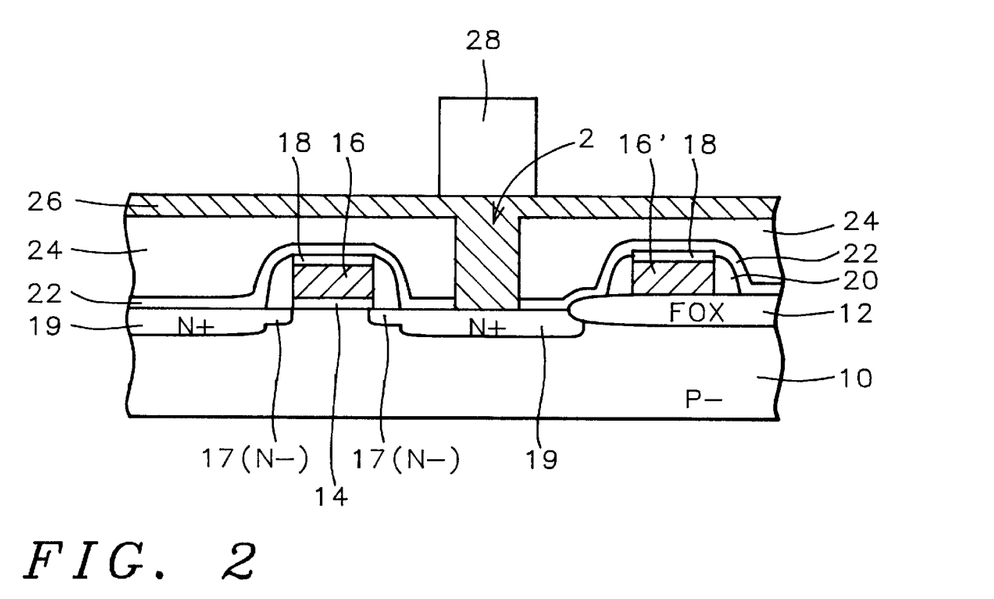

Referring next to FIG. 2, the novel stacked capacitors are formed by depositing a conductively doped first polysilicon layer 26 on the CVD SiO$_2$ layer 24. Layer 26 is deposited by LPCVD using a reactant gas such as silane (SiH$_4$), and is deposited to a thickness sufficient to fill the node contact openings 2, and more specifically is deposited to a thickness of between about 1000 and 5000 Angstroms. The polysilicon layer 26 is doped either in situ during deposition, or after deposition by ion implantation, using an N type dopant such as phosphorus (P), and is doped to a concentration of between about 1.0 E 19 and 1.0 E 20 atoms/cm$^3$.

Still referring to FIG. 2, a relatively thick disposable third insulating layer 28, composed of a doped silicon oxide, is deposited on the first polysilicon layer 26. Preferably layer 28 is deposited by chemical vapor deposition (CVD) using a reactant gas mixture such as TEOS, and ozone (O$_3$) and is doped in situ by adding a dopant gas, such as phosphine (PH$_3$), to form a phosphosilicate glass (PSG). Layer 28 is deposited to a thickness of between about 3000 and 10000 Angstroms. Alternatively, an undoped porous CVD oxide can be deposited which also is easily removed in a hydrofluoric acid solution.

The third insulating layer 28 is then patterned leaving portions 28 having essentially vertical sidewalls over the contact openings 2. Conventional photolithographic techniques and anisotropic etching are used to pattern layer 28 to the surface of the first polysilicon layer 26, as shown in FIG. 2. For example, the plasma etching can be carried out by RIE or in a HDP etcher and using an etchant gas mixture containing carbon tetrafluoride (CF$_4$) and hydrogen (H$_2$) or CHF$_3$ in a carrier gas such as argon (Ar), that etches the silicon oxide glass 28 selectively to the underlying polysilicon layer 26. Hereafter, no further photoresist masking steps are required to make the bottom electrode for this double-crown capacitor having a center post.

Figure 3:
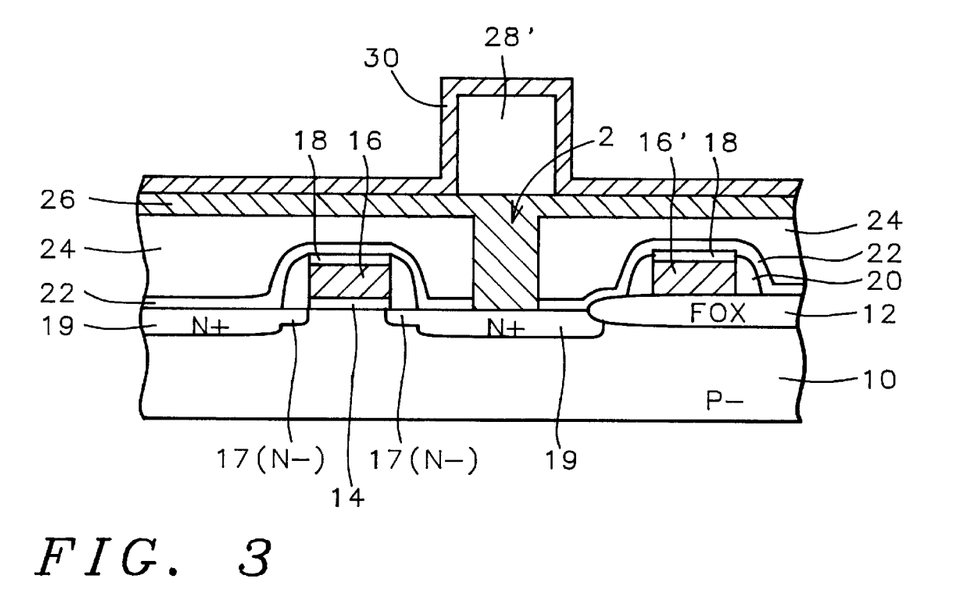

Referring now to FIG. 3, a doped second polysilicon layer 30 is then conformally deposited over the patterned third insulating layer 28. Preferably layer 30 is deposited by LPCVD using a reactant gas such as SiH$_4$, and is doped in situ with phosphorus using phosphine (PH$_3$). Layer 30 is doped to a concentration of between about 1.0 E 19 and 1.0 E 21 atoms/cm$^3$ and is deposited to a thickness of between about 500 and 2500 Angstroms.

Figure 4:
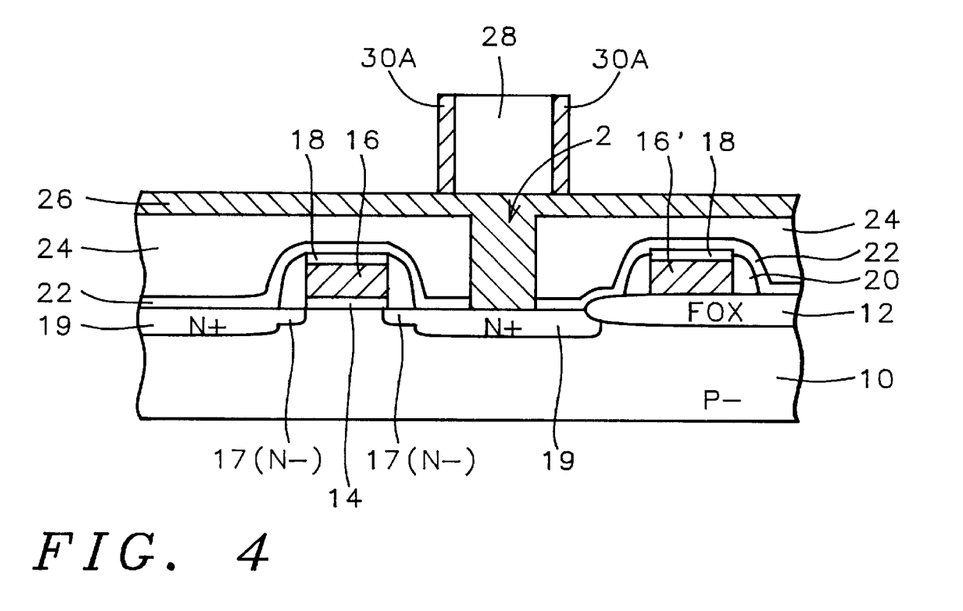

Now as shown in FIG. 4, the second polysilicon layer 30 is anisotropically plasma etched back to form first polysilicon spacers 30A on the sidewalls of the patterned third insulating layer 28. The anisotropic etching is preferably carried out using RIE and an etchant gas, such as hydrogen bromide (HBr) or chlorine (Cl$_2$) gas chemistry.

Figure 5:
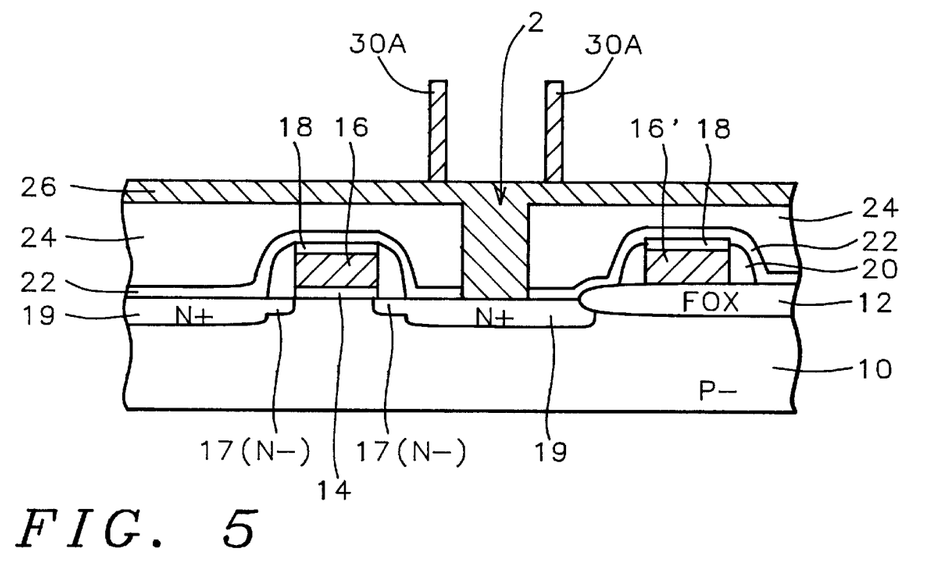

Referring next to FIG. 5, the disposable patterned third insulating layer 28 is then selectively removed. For example, the selective removal of layer 28 can be carried out in a hydrofluoric (HF) acid solution, leaving the first polysilicon spacers 30A extending upward on the first polysilicon layer 26 over the node contact opening 2 to form the inner crown shape structure for the capacitor.

Figure 6:
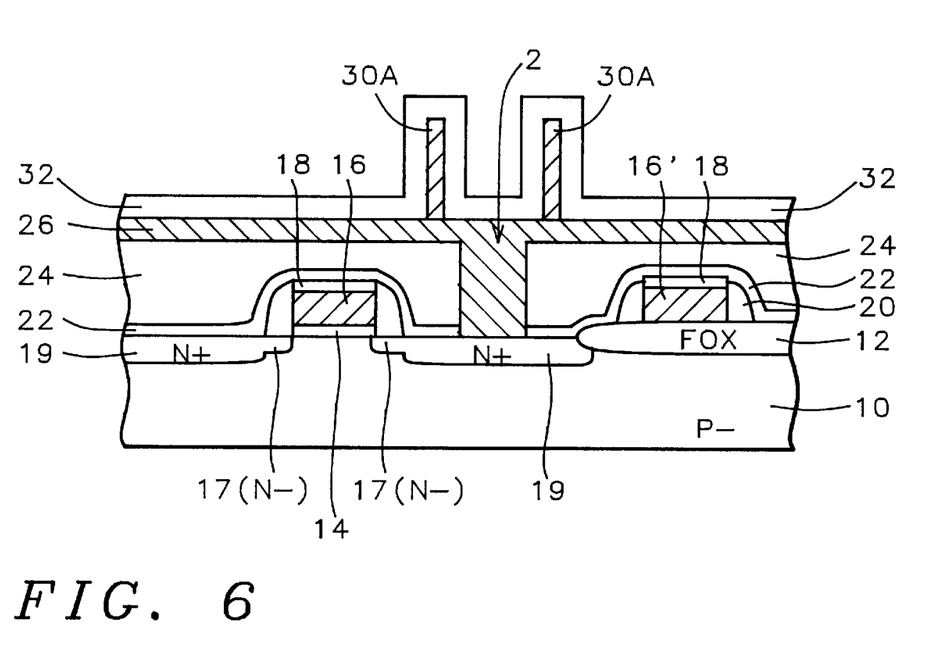

Referring to FIG. 6, a disposable fourth insulating layer 32 is deposited conformally over the first polysilicon spacers 30A. Preferably layer 32 is also a phosphorus doped SiO$_2$ and is deposited by LPCVD using, for example, a reactant gas such as TEOS, and is preferably doped in situ with phosphorus using a dopant gas such as PH$_3$, to form a phosphosilicate glass (PSG). Layer 32 is doped to a concentration sufficient to enhance the etch rate relative to the undoped SiO$_2$ layer 24, or layer 32 can be a porous CVD silicon oxide formed from TEOS and O$_3$ which also etches faster, as is required in a later etching step. Alternatively, the fourth insulating layer 32 can be a Si$_3$N$_4$ which can be selectively removed later in a phosphoric acid etch. Layer 32 is preferably deposited to a thickness of between about 500 and 2500 Angstroms.

Figure 7:
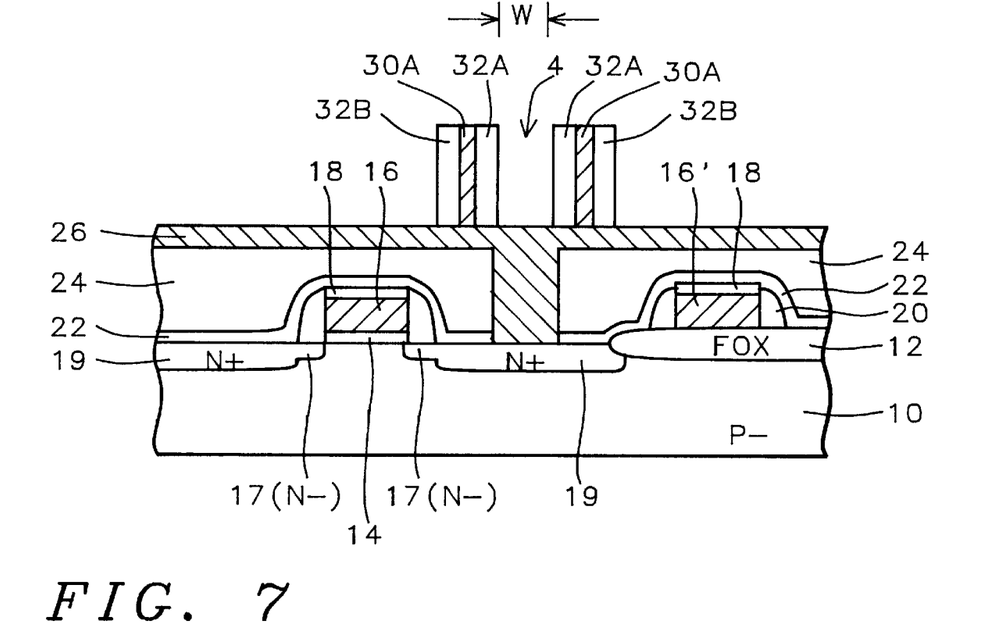

Referring to FIG. 7, layer 32 is anisotropically etched back to form disposable inner insulating sidewall spacers 32A and outer insulating sidewall spacers 32B on the first polysilicon spacers 30A while exposing the top surface of the first polysilicon layer 26, and resulting in an opening 4 having a width W between the inner insulating sidewall spacers 32A. The anisotropic plasma etching is preferably carried out using RIE or HDP etching, and an etchant gas that etches selectively the P doped SiO$_2$ layer 32 to the polysilicon layer 26. For example, the etchant gas can be a gas mixture containing CHF$_3$ or CF$_4$ and H$_2$.

Figure 8:
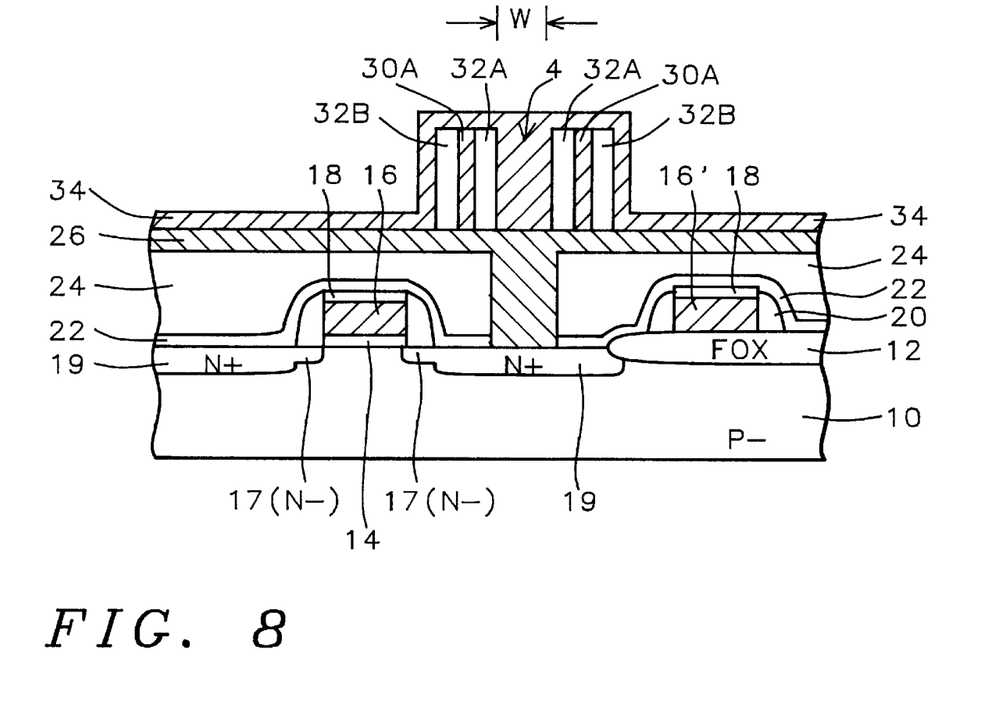

Referring now to FIG. 8, a conformal doped third polysilicon layer 34 is deposited over the inner insulating sidewall spacers 32A and outer insulating sidewall spacers 32B. Polysilicon layer 34 is preferably deposited by LPCVD, and is doped in situ with phosphorus to a concentration of between about 1.0 E 19 and 1.0 E 21 atoms/cm$^3$. Layer 34 is deposited to a thickness sufficient to fill the space (opening) 4 having a width or diameter W within the inner insulating sidewall spacers 32A. More specifically, layer 34 is deposited to a thickness of at least greater than one-half the width W of the opening 4. By way of example, if the opening 4 has a width of W=0.2 micrometers (um), then layer 34 is deposited to a thickness of at least greater than 1000 Angstroms. Typically layer 34 is deposited to a thickness of between about 500 and 2500 Angstroms.

Figure 9:
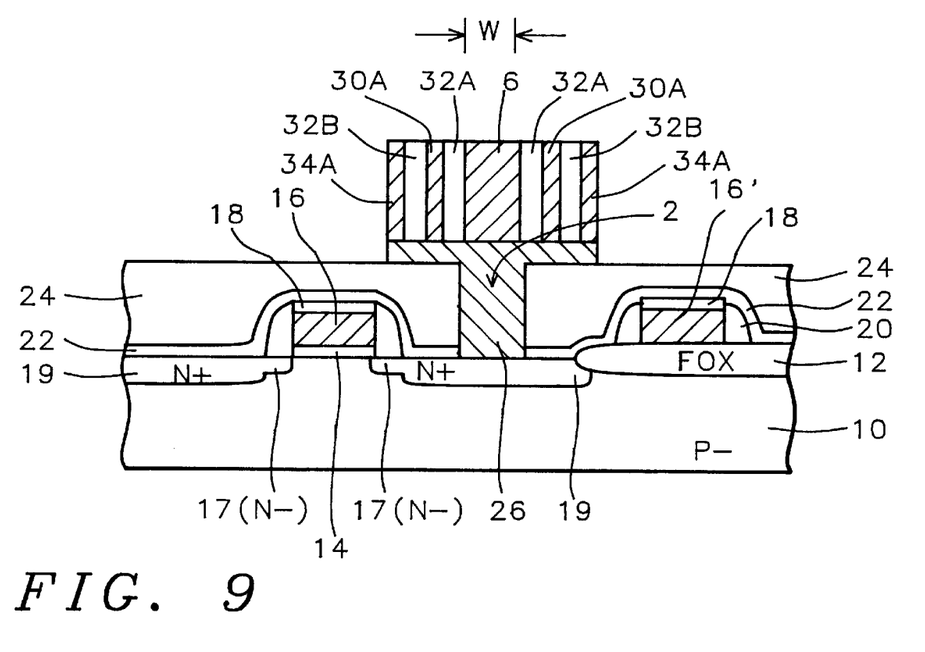

Referring to FIG. 9, the third polysilicon layer 34 is then anisotropically etched back to form second polysilicon spacers 34A on the outer insulating sidewalls spacers 32B. The etching is continued to remove the first polysilicon layer 26 over and down to the second insulating layer 24 adjacent to the capacitor area to electrically isolate the individual bottom electrodes. The etching also results in exposing the top surface of the insulating sidewall spacers 32A and 32B, and results in a portion 6 of the third polysilicon layer 34 remaining to form a center post that further increases the capacitance. The center post 6 also protects the underlying first polysilicon layer 26 over the node contact opening 2 from being overetched, which otherwise, can result in electrical discontinuity between the polysilicon in the node contact in opening 2 and the upper crown shaped structure (30A and 34A).

Figure 10:
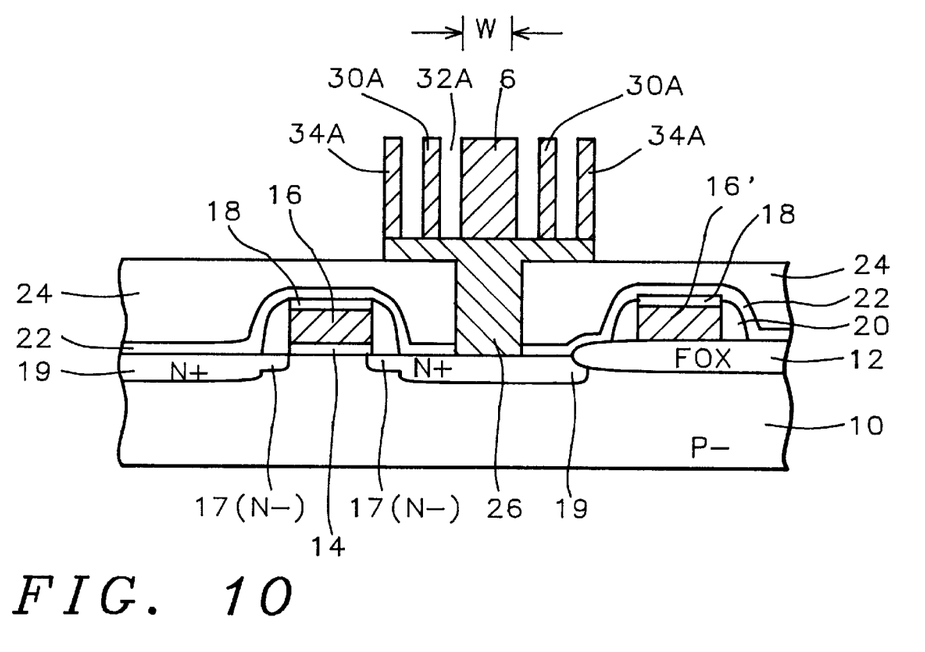

Referring to FIG. 10, the disposable insulating sidewall spacers 32A and 32B (in FIG. 9) are then selectively removed by etching to form a bottom electrode having a double-crown shape formed from polysilicon portions 34A and 30A, a center post 6 and a polysilicon base 26 that makes the node contact to the source/drain contact region 19($N^+$). Preferably the selective etching is carried out in a vapor hydrofluoric (HF) acid etch or in a HF/H2O solution which has an etch-rate ratio of the phosphorus doped silicon oxide to undoped silicon oxide of greater than 10:1. This allows the insulating spacer 32A and 32B to be etched without significantly overetching the second insulating (undoped $SiO_2$) layer 24. Alternatively, the fourth insulating layer 32 can be a $Si_3N_4$ which is then removed in a hot phosphoric acid etch ($H_3PO_4$) while leaving the oxide layer 24 unetched.

Figure 11:
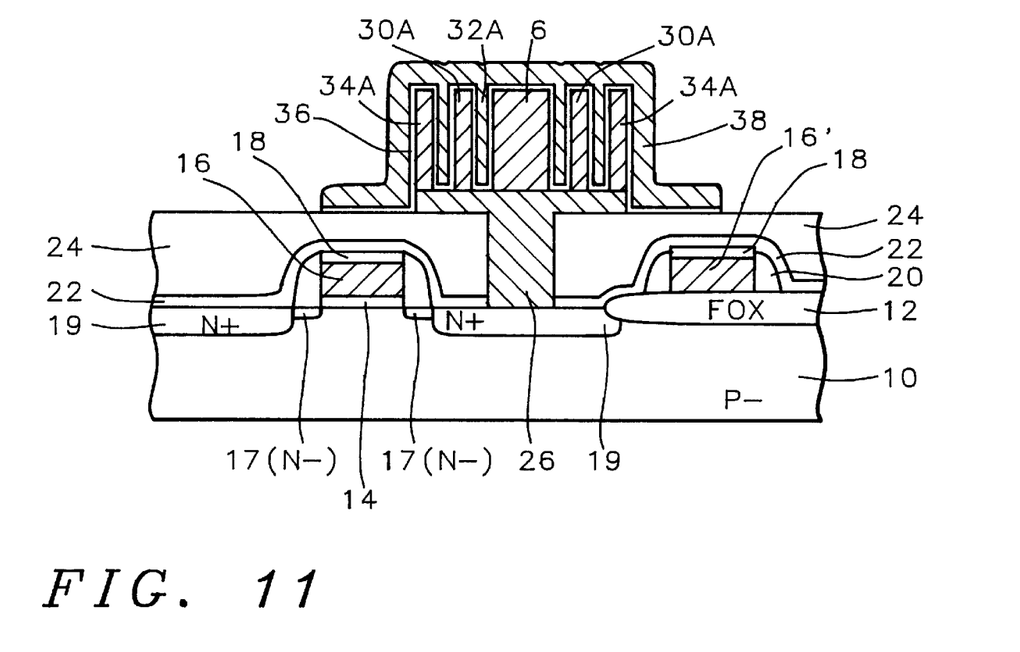

Referring to FIG. 11, the array of stacked capacitors is now completed by forming a thin capacitor dielectric layer 36 on the bottom electrodes composed of the doped polysilicon layers 26, 30A, and 34A, and forming top electrodes from a fourth polysilicon layer 38. Layer 36 is a high-dielectric-constant layer. This layer is typically composed of layers of $Si_3N_4/SiO_2$ (NO), or layers of $SiO_2/Si_3N_4/SiO_2$ (ONO). For example, the ONO dielectric can be formed by growing a thermal oxide on the bottom electrodes, depositing a $Si_3N_4$ layer by LPCVD, and then using an oxidation furnace to form the top $SiO_2$ by partially reducing the Si3N4 layer. Preferably the ONO is formed having a thickness of between about 10 and 100 Angstroms. Alternatively, layer 36 can be tantalum pentoxide ($Ta_2O_5$) or can be used in conjunction with ONO or NO to form the high-dielectric-constant layer.

The fourth polysilicon layer 38 for the top electrodes is deposited by LPCVD using, for example, $SiH_4$, and deposited to a thickness of between about 1000 and 2000 Angstroms. The top electrodes are also heavily $N^+$ doped in situ with P to a concentration of between about 1.0 E 19 and 1.0 E21 atoms/cm$^3$. Layer 38 is then patterned using conventional photolithographic techniques and anisotropic plasma etching to provide the top electrodes for the stacked storage capacitors having increased capacitance. Subsequent conventional processing to form bit lines and other interconnections (not shown in FIG. 11) can be carried out to complete the dynamic random access memory devices having these improved stacked capacitors formed under the bit lines to form capacitor under bit line (CUB) structures. It should be obvious to one skilled in the art that the method of this invention can also apply to capacitor over bit line (COB) structures by forming the bit lines prior to forming the capacitors.

While the invention has been particularly shown and described with reference to the preferred embodiment thereof, it will be understood by those skilled in the art that various changes in form and details may be made without departing from the spirit and scope of the invention.

What is claimed is:

1. A method for fabricating a dynamic random access memory (DRAM) device having stacked capacitors comprising the steps of:

forming field oxide areas on a semiconductor substrate while leaving device areas for fabrication of semiconductor devices;

forming device structures in and on said device areas of said semiconductor substrate;

depositing a first insulating layer over said device areas and said field oxide areas;

depositing a second insulating layer on said first insulating layer;

planarizing said second insulating layer;

forming contact openings in said first and second insulating layers to said device areas where electrical contacts are desired for said stacked capacitors; and forming said stacked capacitors by, depositing a first polysilicon layer over said device areas and said field oxide areas, said first polysilicon layer filling said contact openings and making contact to said device areas;

depositing a disposable third insulating layer on said first polysilicon layer;

patterning by anisotropic plasma etching said third insulating layer to said first polysilicon layer leaving portions of said third insulating layer having vertical sidewalls over said contact openings;

depositing a second polysilicon layer;

anisotropically etching back said second polysilicon layer and forming first polysilicon spacers on said sidewalls of said third insulating layer;

removing selectively said portions of said third insulating layer leaving said first polysilicon spacers on said first polysilicon layer;

depositing a disposable fourth insulating layer over said first polysilicon spacers and on said first polysilicon layer;

anisotropically plasma etching back said fourth insulating layer to form inner and outer insulating sidewall spacers on said first polysilicon spacers;

depositing a third polysilicon layer on said inner and outer insulating sidewall spacers and on said first polysilicon layer;

anisotropically plasma etching back said third polysilicon layer and said first polysilicon layer, thereby forming second polysilicon spacers on said outer insulating sidewall spacers while retaining said third polysilicon layer between said inner insulating sidewall spacers to form a center post, and further, said etching of said first polysilicon layer electrically isolating from each other bottom electrodes for said stacked capacitors;

removing selectively said inner and outer insulating sidewall spacers to form said bottom electrodes having said center post;

forming a capacitor dielectric layer on said bottom electrodes;

depositing and patterning a fourth polysilicon layer to form top electrodes thereby completing said DRAM device with said stacked capacitors.

2. The method of claim 1, wherein said first insulating layer is composed of a silicon oxide layer and an upper silicon nitride layer having a total thickness of between about 1000 and 2000 Angstroms.

3. The method of claim 1, wherein said second insulating layer is a silicon oxide ($SiO_2$) deposited by chemical vapor deposition and has a thickness of between about 3000 and 10000 Angstroms.

4. The method of claim 1, wherein said second insulating layer is planarized by chemical/mechanical polishing (CMP).

5. The method of claim 1, wherein said first polysilicon layer is deposited to a thickness of between about 1000 and 5000 Angstroms.

6. The method of claim 1, wherein said third insulating layer is a phosphosilicate glass (PSG) deposited to a thickness of between about 3000 and 10000 Angstroms.

7. The method of claim 1, wherein said second polysilicon layer has a thickness of between about 500 and 2500 Angstroms.

8. The method of claim 1, wherein said third insulating layer is selectively removed in hydrofluoric acid.

9. The method of claim 1, wherein said fourth insulating layer is a phosphosilicate glass (PSG) deposited by chemical vapor deposition to a thickness of between about 500 and 2500 Angstroms.

10. The method of claim 1, wherein said third polysilicon layer is deposited to a thickness of between about 500 and 2500 Angstroms.

11. The method of claim 1, wherein said inner and outer insulating sidewall spacers are selectively removed in a hydrofluoric acid (HF) solution.

12. The method of claim 1, wherein said capacitor dielectric layer is composed of a silicon oxide/silicon nitride/silicon oxide (ONO) having a thickness of between about 10 and 100 Angstroms.

13. The method of claim 1, wherein said fourth polysilicon layer has a thickness of between about 1000 and 2000 Angstroms.

14. The method of claim 1, wherein said first, second, third, and fourth polysilicon layers are conductively doped N type with phosphorus.

15. A method for fabricating a dynamic random access memory (DRAM) device having stacked capacitors comprising the steps of:

forming field oxide areas on a semiconductor substrate while leaving device areas for fabrication of semiconductor devices;

forming a gate oxide on said device areas;

depositing and patterning an electrically conductive layer having a cap oxide to form gate electrodes over said device areas and word lines over said field oxide areas;

forming lightly doped source/drain regions in said device areas adjacent to said gate electrodes;

depositing and etching back a spacer silicon oxide layer to form spacers on sidewalls of said gate electrodes;

forming source/drain contact regions in said device areas adjacent to said spacers thereby forming field effect transistors (FETs);

depositing a first insulating layer over said device areas and said field oxide areas;

depositing a second insulating layer on said first insulating layer;

planarizing said second insulating layer;

forming contact openings in said first and second insulating layers to said device areas where electrical contacts are desired for said stacked capacitors; and forming said stacked capacitors by, depositing a first polysilicon layer over said device areas and said field oxide areas, said first polysilicon layer filling said contact openings and making contact to said device areas;

depositing a disposable third insulating layer on said first polysilicon layer;

patterning by anisotropic plasma etching said third insulating layer to said first polysilicon layer leaving portions of said third insulating layer having vertical sidewalls over said contact openings;

depositing a second polysilicon layer;

anisotropically etching back said second polysilicon layer and forming first polysilicon spacers on said sidewalls of said third insulating layer;

removing selectively said portions of said third insulating layer leaving said first polysilicon spacers on said first polysilicon layer;

depositing a disposable fourth insulating layer over said first polysilicon spacers and on said first polysilicon layer;

anisotropically plasma etching back said fourth insulating layer to form inner and outer insulating sidewall spacers on said first polysilicon spacers;

depositing a third polysilicon layer on said inner and outer insulating sidewall spacers and on said first polysilicon layer;

anisotropically plasma etching back said third polysilicon layer and said first polysilicon layer, thereby forming second polysilicon spacers on said outer insulating sidewall spacers while retaining said third polysilicon layer between said inner insulating sidewall spacers to form a center post, and further, said etching of said first polysilicon layer electrically isolating from each other bottom electrodes for said stacked capacitors;

removing selectively said inner and outer insulating sidewall spacers to form said bottom electrodes having said center post;

forming a capacitor dielectric layer on said bottom electrodes;

depositing and patterning a fourth polysilicon layer to form top electrodes thereby completing said DRAM device with said stacked capacitors.

16. The method of claim 15, wherein said first insulating layer is composed of a silicon oxide layer and an upper silicon nitride layer having a total thickness of between about 1000 and 2000 Angstroms.

17. The method of claim 15, wherein said second insulating layer is a silicon oxide ($SiO_2$) deposited by chemical vapor deposition and has a thickness of between about 3000 and 10000 Angstroms.

18. The method of claim 15, wherein said second insulating layer is planarized by chemical/mechanical polishing (CMP).

19. The method of claim 15, wherein said first polysilicon layer is deposited to a thickness of between about 1000 and 5000 Angstroms.

20. The method of claim 15, wherein said third insulating layer is a phosphosilicate glass (PSG) deposited to a thickness of between about 3000 and 10000 Angstroms.

21. The method of claim 15, wherein said second polysilicon layer has a thickness of between about 500 and 2500 Angstroms.

22. The method of claim 15, wherein said third insulating layer is selectively removed in hydrofluoric acid.

23. The method of claim 15, wherein said fourth insulating layer is a phosphosilicate glass (PSG) deposited by chemical vapor deposition to a thickness of between about 500 and 2500 Angstroms.

24. The method of claim 15, wherein said third polysilicon layer is deposited to a thickness of between about 500 and 2500 Angstroms.

25. The method of claim 15, wherein said inner and outer insulating sidewall spacers are selectively removed in a hydrofluoric acid (HF) solution.

26. The method of claim 15, wherein said capacitor dielectric layer is composed of a silicon oxide/silicon nitride/silicon oxide (ONO) having a thickness of between about 10 and 100 Angstroms.

27. The method of claim 15, wherein said fourth polysilicon layer has a thickness of between about 1000 and 2000 Angstroms.

28. The method of claim 15, wherein said first, second, third, and fourth polysilicon layers are conductively doped N type with phosphorus.

* * * * *